(12) United States Patent
Qu (10) Patent No.: US 12,495,527 B2
(45) Date of Patent: Dec. 9, 2025

(54) LIQUID-COOLING HEAT DISSIPATION DEVICE, CABINET, AND SYSTEM

(71) Applicant: XI'AN YEP TELECOM TECHNOLOGY CO., LTD., Shaanxi (CN)

(72) Inventor: Zhongjiang Qu, Shaanxi (CN)

(73) Assignee: XI'AN YEP TELECOM TECHNOLOGY CO., LTD., Shaanxi (CN)

( * ) Notice: Subject to any disclaimer, the term of this patent is extended or adjusted under 35 U.S.C. 154(b) by 294 days.

(21) Appl. No.: 18/285,291

(22) PCT Filed: Nov. 5, 2021

(86) PCT No.: PCT/CN2021/129144
§ 371 (c)(1),
(2) Date: Oct. 2, 2023

(87) PCT Pub. No.: WO2022/205917
PCT Pub. Date: Oct. 6, 2022

(65) Prior Publication Data
US 2024/0057298 A1 Feb. 15, 2024

(30) Foreign Application Priority Data
Apr. 2, 2021 (CN) .......................... 202110362479.3

(51) Int. Cl.
*H05K 7/20* (2006.01)
*H05K 7/04* (2006.01)
(52) U.S. Cl.
CPC ......... *H05K 7/208* (2013.01); *H05K 7/20318* (2013.01); *H05K 7/20327* (2013.01);
(Continued)

(58) Field of Classification Search
CPC ........... H05K 7/20309; H05K 7/20318; H05K 7/20327; H05K 7/2039; H05K 7/20409;
(Continued)

(56) References Cited

U.S. PATENT DOCUMENTS 6,643,132 B2 * 11/2003 Faneuf ............... H05K 7/20809
165/80.4
7,403,384 B2 * 7/2008 Pflueger ............. H05K 7/20545
361/679.48
(Continued)

FOREIGN PATENT DOCUMENTS

CN 1536958 A 10/2004
CN 2708371 Y 7/2005
(Continued)

OTHER PUBLICATIONS

Machine translation completed Sep. 11, 2025 for JP5860728 by Fumio Takeda (Year: 2025).*
(Continued)

*Primary Examiner* — Jayprakash N Gandhi
*Assistant Examiner* — Steven Ngo
(74) *Attorney, Agent, or Firm* — The PL Law Group, PLLC (57) ABSTRACT

A liquid-cooling heat dissipation device includes a pipeline outlet formed on an exterior sidewall of a chassis, wherein the exterior sidewall is an exterior wall of side panel in contact with a chassis panel and an IO port panel of the chassis, a circuit board fixed on an inner bottom surface of the chassis, an evaporator fixed on the circuit board with a preset gap, forming an accommodating space with the circuit board, a heat-generating electronic component mounted on the circuit board within the accommodating space, electrically connected to the circuit board and thermally connected to the evaporator, a condenser fixed to the (Continued)

exterior sidewall where the pipeline outlet is located, and a vapor pipeline and a liquid pipeline pass through the pipeline outlet, connecting the evaporator and the condenser.

8 Claims, 5 Drawing Sheets

(52) U.S. Cl.
CPC ....... *H05K 7/2039* (2013.01); *H05K 7/20809* (2013.01); *H05K 7/20818* (2013.01); *H05K 7/04* (2013.01)

(58) Field of Classification Search
CPC .......... H05K 7/20436; H05K 7/20663; H05K 7/208; H05K 7/20809; H05K 7/20818; H05K 2201/064; H05K 7/04; H01L 23/46; H01L 23/473
See application file for complete search history.

(56) References Cited

U.S. PATENT DOCUMENTS

| | | | | |
|---|---|---|---|---|
| 7,539,020 | B2* | 5/2009 | Chow | H05K 7/20781 361/759 |
| 9,483,091 | B2* | 11/2016 | Watanabe | G06F 1/20 |
| 9,901,007 | B1* | 2/2018 | Reynov | H05K 7/20309 |
| 10,897,837 | B1* | 1/2021 | Chehade | H05K 7/20809 |
| 2003/0057546 | A1 | 3/2003 | Memory et al. | |
| 2005/0068728 | A1* | 3/2005 | Chu | H05K 7/20772 361/679.48 |
| 2005/0144968 | A1 | 7/2005 | Shakespeare | |
| 2011/0277967 | A1* | 11/2011 | Fried | H05K 7/20809 165/104.26 |
| 2013/0107455 | A1 | 5/2013 | Cottet et al. | |
| 2014/0345829 | A1* | 11/2014 | Kang | H05K 7/20318 165/104.21 |

FOREIGN PATENT DOCUMENTS

| | | |
|---|---|---|
| CN | 101242729 A | 8/2008 |
| CN | 101779178 A | 7/2010 |
| CN | 203786651 U | 8/2014 |
| CN | 205091697 U | 3/2016 |
| CN | 106684500 A | 5/2017 |
| CN | 106937517 A | 7/2017 |
| CN | 206431562 U | 8/2017 |
| CN | 107124853 A | 9/2017 |
| CN | 108024485 A | 5/2018 |
| CN | 108762454 A | 11/2018 |
| CN | 108803835 A | 11/2018 |
| CN | 109244051 A | 1/2019 |
| CN | 109413945 A | 3/2019 |
| CN | 109870053 A | 6/2019 |
| CN | 110139535 A | 8/2019 |
| CN | 110213933 A | 9/2019 |
| CN | 209787684 U | 12/2019 |
| CN | 110958822 A | 4/2020 |
| CN | 113163683 A | 7/2021 |
| EP | 3 490 357 A1 | 5/2019 |
| IN | 106163242 A | 11/2016 |
| JP | 2012-198019 A | 10/2012 |
| JP | 2013-175069 A | 9/2013 |
| JP | 2013-182439 A | 9/2013 |
| JP | 5860728 B2 * | 2/2016 |

OTHER PUBLICATIONS

Office action issued on Oct. 1, 2024 from Japan Intellectual Property Office in a counterpart Japanese Patent Application No. 2023-559839 (all the cited references are listed in this IDS.) (English translation is also submitted herewith.).

International Search Report for PCT/CN2021/129144 mailed on Jan. 11, 2022.

* cited by examiner

LIQUID-COOLING HEAT DISSIPATION DEVICE, CABINET, AND SYSTEM

CROSS REFERENCE OF RELATED APPLICATION AND CLAIM OF PRIORITY

This application claims benefit under 35 U.S.C. 119, 120, 121, or 365(c), and is a National Stage entry from International Application No. PCT/CN2021/129144, filed Nov. 5, 2021, which claims priority to the benefit of Chinese patent application No. 202110362479.3 filed in the China Intellectual Property Office on Apr. 2, 2021, the entire contents of which are incorporated herein by reference.

BACKGROUND

1. Technical Field

Embodiments of the present disclosure relate to the technical field of liquid cooling, and in particular, to a liquid-cooling heat dissipation device, a cabinet, and a system.

2. Background Art

A data center is a global collaborative network of specific devices used to transmit, accelerate, display, calculate, and store data information on the Internet network infrastructure. It is composed of countless computer hardware. With the continuous increase of computer hardware in the data center, the data center faces increasing pressure on heat dissipation and energy saving. Research has found that liquid-cooling heat dissipation can reduce the Power Usage Effectiveness (PUE) of the data center to below 1.2, and the closer the PUE is to 1, the better the energy efficiency level of the data center. Therefore, from the perspective of data center heat dissipation and energy saving needs, liquid cooling technology is an inevitable choice.

Figure 1:
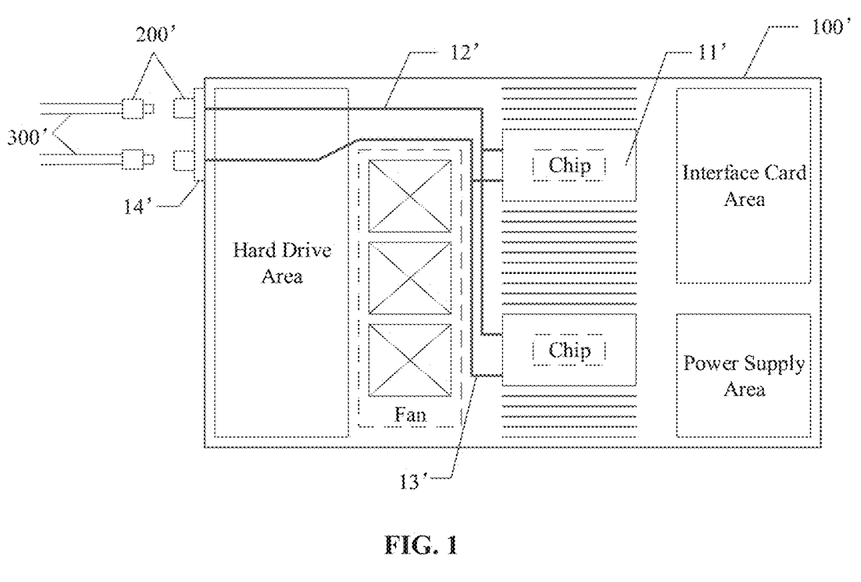
FIG. 1 is a schematic diagram of the structure of a heat dissipation device located inside a chassis in a traditional cold plate liquid cooling scheme.

At present, the cold plate liquid cooling scheme is widely used in IT/telecommunication equipment and data centers. Although the cold plate liquid cooling scheme has less limitations on the construction of the data center, there are the following problems in terms of heat dissipation reliability, piping layout design, and maintainability in the current cold plate liquid cooling scheme:

1. Heat Dissipation Reliability: Referring to FIG. 1, it can be seen that the current cold plate liquid cooling scheme has a cold plate 11', a cold water pipeline 12' and a hot water pipeline 13' inside an electronic equipment, such as a chassis 100'. The cold plate 11', the cold water pipeline 12' and the hot water pipeline 13' are assembled together by welding or clamping. There is liquid (usually water) inside the cold plate 11'. Due to the problems in the manufacturing and assembly process of the cold plate 11', the cold water pipeline 12' and the hot water pipeline 13', there is a risk of liquid leakage in the cold plate 11', the cold water pipeline 12' and the hot water pipeline 13'. In addition, quick connectors 200' and hoses 300' are generally connected to the cabinet's manifold outside the chassis 100'. Since the quick connectors 200' are movable parts, systems like data centers adopting the cold plate liquid cooling scheme shown in FIG. 1 have a risk of liquid leakage during long-term operation.
2. Piping Layout Issue: In the current cold plate liquid cooling scheme, there are two ways for the cold plate 11', the cold water pipeline 12' and the hot water pipeline 13' to exit from the inside of the chassis 100', namely front exit and rear exit. Referring to FIG. 1, the front exit means exiting from the side of the liquid cooling panel 14' on the chassis 100'. Since hard drives are generally housed on the side of the liquid cooling panel 14' on the 100', to lay out the cold water pipeline 12' and the hot water pipeline 13', some hard drives need to be removed, affecting both the performance of the system and the aesthetics of the device. The rear exit is from the input/output (IO) port side, which, of course, requires removing some IOs, impacting the overall system performance.
3. Maintainability Issue: The chassis 100' or any independent data processing node in the chassis 100' requires the quick connectors 200' and the hoses 300' to be connected to the cabinet's manifold. When maintaining the chassis 100' or a node therein, the quick connectors 200' need to be unplugged (separating the male and female parts) or connected. Furthermore, when maintaining a node, its modules (such as hard drives) may be interfered with by the upper and lower pipelines (where the cold water pipeline 12' and the hot water pipeline 13' come from), making them difficult to smoothly plug and unplug. This results in some maintainability issues, lacking the convenience seen in air-cooled systems.

SUMMARY

Embodiments of the present disclosure provide a liquid-cooling heat dissipation device, including: a chassis, a circuit board, an evaporator, a heat-generating electronic component, a condenser, a vapor pipeline, and a liquid pipeline; wherein An exterior sidewall of the chassis is equipped with a pipeline outlet, and the exterior sidewall is an exterior wall of a side panel in contact with a chassis panel and an IO port panel of the chassis;

The circuit board is fixed on an inner bottom surface of the chassis;

The evaporator is fixed on the circuit board with a preset gap, forming an accommodating space with the circuit board;

The heat-generating electronic component is mounted on the circuit board within the accommodating space, electrically connected to the circuit board and thermally connected to the evaporator;

The condenser is fixed on the exterior sidewall where the pipeline outlet is located;

The vapor pipeline and the liquid pipeline pass through the pipeline outlet, connecting the evaporator and the condenser;

When the heat-generating electronic component is operating, liquid inside the evaporator absorbs heat emitted by the heat-generating electronic component and vaporizes into vapor, enters the condenser along the vapor pipeline under the internal vapor pressure, and returns to the evaporator along the liquid pipeline after being cooled into liquid by the condenser.

Embodiments of the present disclosure further provide a liquid-cooling heat dissipation cabinet, including: two front pillars near a front door of the cabinet, two rear pillars near a rear door of the cabinet, a chassis tray for placing the aforementioned liquid-cooling heat dissipation device, and a liquid cooling mechanism used in conjunction with the condenser fixed on the exterior sidewall of the liquid-cooling heat dissipation device; wherein The chassis tray is fixed within an area enclosed by the two front pillars and the two rear pillars, and is secured through the two front pillars and the two rear pillars;

The liquid cooling mechanism is fixed above the chassis tray, on the rear pillar on the same side as the condenser.

Embodiments of the present disclosure further provide a liquid-cooling heat dissipation system, including: the aforementioned liquid-cooling heat dissipation device, and the aforementioned liquid-cooling heat dissipation cabinet; wherein The liquid-cooling heat dissipation device is placed on the chassis tray in the liquid-cooling heat dissipation cabinet, and when being mounted along the chassis tray into the liquid-cooling heat dissipation cabinet, each condenser fixed on the exterior sidewall of the liquid-cooling heat dissipation device contacts with a cold plate fixed on the rear pillar in the liquid-cooling heat dissipation cabinet through a heat-conductive pad, and the cold plate slides towards the rear pillar along a cold plate slide structure, compressing an elastic member between the cold plate and the rear pillar from a naturally extended state to a compressed state, which ensures the cold plate conducts heat to the condenser through contact with the heat-conductive pad, assisting the condenser and the evaporator inside the liquid-cooling heat dissipation device in dissipating heat from the heat-generating electronic component within the liquid-cooling heat dissipation device.

DETAILED DESCRIPTION

The technical solutions in the embodiments of the present disclosure will be clearly and completely described below with reference to the drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative efforts fall within the scope of protection of the present disclosure.

It should be noted that if there are directional indications (such as up, down, left, right, front, back, etc.) involved in the embodiments of the present disclosure, these directional indications are only for explaining the relative positional relationships between the components in a certain posture (as shown in the accompanying drawings). If the specific posture changes, the directional indications will also change accordingly.

In addition, if there are descriptions such as "first", "second", etc. in the embodiments of the present disclosure, these descriptions of "first", "second", etc. are only for the purpose of description, and should not be construed as indicating or implying their relative importance or implicitly indicates the number of technical features indicated. Thus, features defined as "first", "second", etc. can explicitly or implicitly include at least one of such feature. Furthermore, technical solutions between different embodiments can be combined, but must be based on what those of ordinary skill in the art can achieve. If the combination of technical solutions results in contradictions or infeasibilities, this kind of combination should be considered non-existent and is not within the scope of protection claimed in this disclosure.

An embodiment of the present disclosure provides a liquid-cooling heat dissipation device. The liquid-cooling heat dissipation device can be a server, a switch, a communication device, etc. In a specific implementation, the liquid-cooling heat dissipation device mentioned in this embodiment includes but is not limited to: a chassis, a circuit board, an evaporator, a heat-generating electronic component, a condenser, a vapor pipeline, a liquid pipeline, a hard drive area, a fan, a memory, an interface card area and a power supply area.

Figure 2:
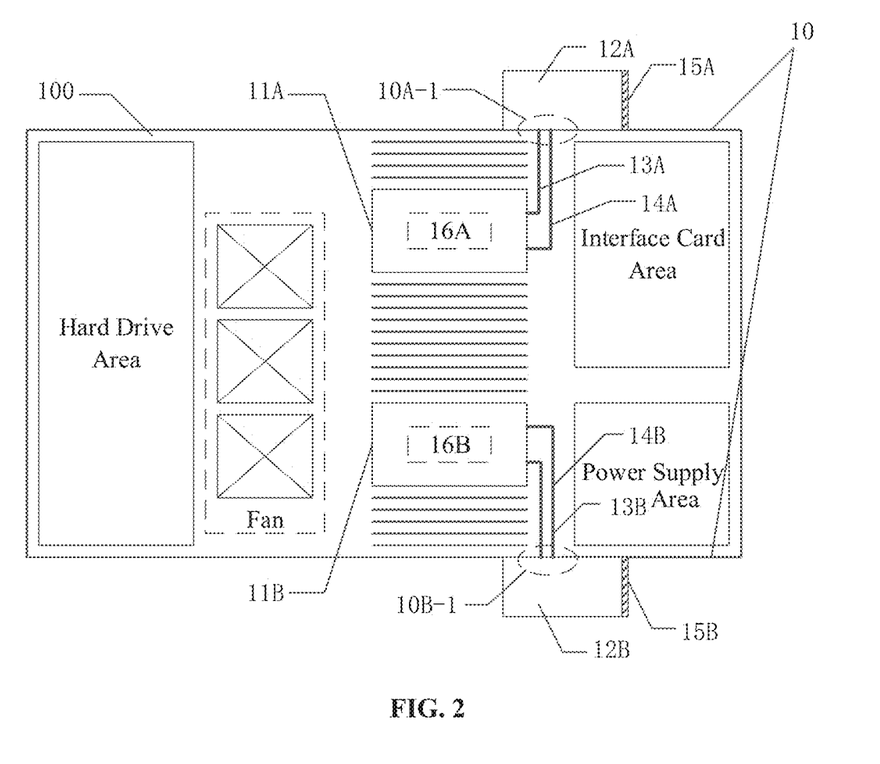
FIG. 2 is a schematic structural diagram of a liquid-cooling heat dissipation device provided by an embodiment of the present disclosure.
Figure 3:
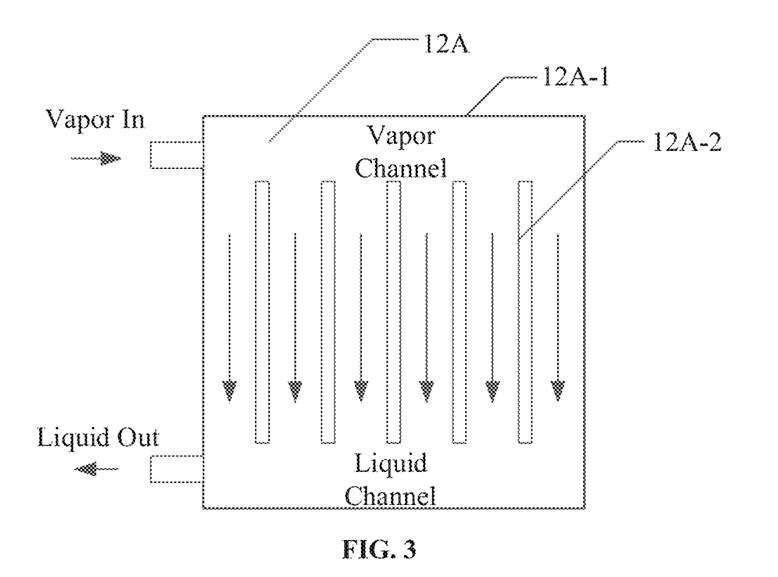
FIG. 3 is a schematic internal structural diagram of a condenser 12A in a liquid cooling device provided by an embodiment of the present disclosure.

For the convenience of description, this embodiment takes a server of a data center as an example, and is described in conjunction with FIG. 2 and FIG. 3.

As shown in FIG. 2, in this specific implementation, a chassis 100 of a liquid-cooling heat dissipation device in this embodiment has pipeline outlets, such as 10A-1 and 10B-1, formed on its exterior sidewall 10. A circuit board (not shown in FIG. 2) is fixed on an inner bottom surface of the chassis 100. Evaporators 11A and 11B are respectively fixed on the circuit board with a preset gap, forming an accommodating space with the circuit board. A heat-generating electronic component 16A is installed within an accommodating space formed by the evaporator 11A and the circuit board, and is electrically connected to the circuit board and thermally connected to the evaporator 11A. The heat-generating electronic component 16B is installed within an accommodating space formed by the evaporator 11B and the circuit board, and is electrically connected to the circuit board and thermally connected to the evaporator 11B. A condenser 12A is fixed to the exterior sidewall 10 in an area where the pipeline outlet 10A-1 is located, and a condenser 12B is fixed to the exterior sidewall 10 in an area where the pipeline outlet 10B-1 is located. A vapor pipeline 13A and a liquid pipeline 14A pass through the pipeline outlet 10A-1 to connect the evaporator 11A with the condenser 12A, and a vapor pipeline 13B and a liquid pipeline 14B pass through the pipeline outlet 10B-1 to connect the evaporator 11B with the condenser 12B.

Based on the above structure, when the heat-generating electronic components 16A and 16B are operating, liquids inside their respective evaporators 11A and 11B absorb heat emitted by the heat-generating electronic components 16A and 16B and vaporize into vapor. Under the internal vapor pressure, the vapor enters the corresponding condensers 12A and 12B along their respective vapor pipelines 13A and 13B. After being cooled by the condensers 12A and 12B, the vapor condenses into liquid and returns to the evaporators 11A and 11B along their respective liquid pipelines 14A and 14B.

Due to the process of condensing vapor into liquid by the condensers 12A and 12B, the vapor will continuously release heat and then become a cooler liquid. Therefore, through the cooperation of the evaporator and the condenser, the heat generated by the heat-generating electronic component can be rapidly dissipated, achieving fast cooling of the heat-generating electronic component.

In an embodiment of the present disclosure, the exterior sidewall 10 mentioned in this embodiment specifically refers to an exterior wall of a side panel that contacts with a chassis panel (the panel corresponding to the left side of the hard drive area in FIG. 2) and an IO port panel (the panel corresponding to the right side of the interface card area and the power supply area in FIG. 2) of the chassis 100.

In an embodiment of the present disclosure, regarding the pipeline outlets formed on the exterior sidewall 10, such as 10A-1 and 10B-1 in FIG. 2, their specific locations on the exterior sidewall 10 can be reasonably planned based on the positions of the heat-generating electronic components 16A and 16B inside the chassis 100, as well as the gaps around these heat-generating electronic components 16A and 16B, the layout of other electronic components, such as IO interfaces, power supplies, hard drives, etc. The aim is to facilitate the layout of the vapor pipeline and the liquid pipeline connecting the condensers and evaporators within the chassis 100.

In an embodiment of the present disclosure, the number of pipeline outlets formed on the exterior sidewall 10 can be determined based on the number of condensers required in the entire liquid-cooling heat dissipation device. For instance, each pipeline outlet can correspond to a single condenser, or one pipeline outlet can correspond to multiple condensers. As depicted in FIG. 2, each pipeline outlet corresponds to a single condenser, such as the pipeline outlet 10A-1 corresponding to the condenser 12A and the pipeline outlet 10B-1 corresponding to the condenser 12B. However, this is not limiting in practical applications.

In an embodiment of the present disclosure, the aforementioned heat-generating electronic components 16A and 16B include but are not limited to power-consuming components such as a Central Processing Unit (CPU) and a memory in the liquid-cooling heat dissipation device. There are no specific constraints on this in this embodiment.

For a better understanding of the condenser in the liquid-cooling heat dissipation device, this embodiment provides a condenser with a specific structure, specifically a condenser with a fin structure.

For convenience of description, the condenser 12A is taken as an example below to elaborate a fin-structured condenser.

As shown in FIG. 3, the condenser 12A includes a base plate (not shown in FIG. 3), a casing 12A-1, a plurality of condenser fins 12A-2, a vapor inlet and a liquid outlet.

In an embodiment of the present disclosure, the casing 12A-1 and the base plate together form a sealed chamber. The plurality of condenser fins 12A-2 are arranged side by side at intervals and are fixed to the base plate within the chamber. The vapor inlet, which connects to the vapor pipeline 13A (as seen in FIG. 2), is located at one end of the casing 12A-1's sidewall, parallel to the plurality of condenser fins 12A-2. The liquid outlet, which connects to the liquid pipeline 14A, is located at the opposite end of the same sidewall of the casing 12A-1, parallel to the plurality of condenser finds 12A-2, as shown in FIG. 3.

In an embodiment of the present disclosure, to ensure that the cooled liquid can flow back to the evaporator promptly, the liquid outlet should be located at the very bottom of the sidewall of casing 12A-1, which is parallel to the plurality of condenser fins 12A-2, as shown in FIG. 3. This design ensures that even if there's a small amount of cooled liquid, it can still flow back to the evaporator 13A.

When fixing the aforementioned evaporator onto the circuit board with a preset gap, the gap is specifically determined based on the thickness of the heat-generating electronic components that need to be positioned within the formed accommodating space. That is, the formed accommodating space can ensure that the heat-generating electronic components are installed onto the circuit board within this space. Additionally, the top surface of the heat-generating electronic component It is fixed on the circuit board in the accommodating space, and the upper surface of the heat-generating electronic components (away from the side in contact with the circuit board) should be as close to the evaporator as possible, ensuring that the heat emitted from the heat-generating electronic component during its operation can be either fully or maximally absorbed by the evaporator.

In practical applications, to enhance the heat transfer effect between the heat-generating electronic component and the evaporator, a heat-conductive pad can be arranged on the top surface of the heat-generating electronic component. The two opposite surfaces of this heat-conductive pad would be in contact with the heat-generating electronic component and the evaporator, respectively. This ensures that the heat-generating electronic component is in close contact with the evaporator via the heat-conductive pad, allowing for maximum and rapid heat transfer from the heat-generating electronic components to the evaporator.

Moreover, given the flexibility of the heat-conductive pad, placing it between the heat-generating electronic component and the evaporator, can effectively prevent potential damage to the components caused by direct contact or compression between the heat-generating electronic component and the evaporator.

In an embodiment of the present disclosure, the above examples given in FIG. 2 and FIG. 3 are solely for better understanding of the technical solutions of the present embodiment, and are not exclusive constraints.

That is, in practical applications, the number of condensers arranged on the exterior sidewall of the chassis is not limited to two (2), and the number of condensers can be specifically determined based on the number of heat-generating electronic components that need heat dissipation within the liquid-cooling heat dissipation device. For example, one heat-generating electronic component may correspond to one condenser.

In an embodiment of the present disclosure, the number of condensers can also be determined by the cooling efficiency of the condenser. For example, when a high-efficiency condenser is chosen, multiple heat-generating electronic components can correspond to one condenser. Conversely, one heat-generating electronic component might correspond to one condenser, or one heat-generating electronic component might correspond to multiple condensers. This embodiment does not place specific limitations on this matter.

Correspondingly, concerning the evaporator used to absorb the heat emitted by the heat-generating electronic components, in practical applications, one heat-generating electronic component may be set to correspond to one evaporator, or multiple heat-generating electronic components in the same area may be set to correspond to one evaporator. This embodiment does not place specific limitations on this matter.

In practical applications, if the number of condensers is even, such as two (2) in FIG. 2, in order to ensure the symmetry and balance of the overall appearance of the chassis, it's necessary to form pipeline outlets on the two opposite exterior sidewalls of the chassis, such as the pipeline outlets 10A-1 and 10B-1 in FIG. 2.

An even number of condensers needs to be symmetrically fixed on the exterior sidewalls where the pipeline outlets are located. As shown in FIG. 2, the condenser 12A should be fixed on the exterior sidewall where the pipeline outlet 10A-1 is located, and the condenser 12B should be fixed on the exterior sidewall where the pipeline outlet 10B-1 is located.

In an embodiment of the present disclosure, since the liquid-cooling heat dissipation device provided in this embodiment, which is a server in a data center, needs to be installed in a liquid-cooling heat dissipation cabinet dedicated for the server in actual use, the liquid-cooling heat dissipation device may further include a heat-conductive pad, in order to make the liquid cooling heat dissipation device compatible with the liquid-cooling heat dissipation cabinet, enhancing the heat dissipation effect.

When the liquid-cooling heat dissipation device is placed into the liquid-cooling heat dissipation cabinet, the condenser is in contact with the cold plate of the liquid-cooling heat dissipation cabinet, and secondary heat dissipation of the heat-generating electronic components can be realized through the cooperation of the condenser and the cold plate. Hence, the heat-conductive pad can be specifically placed on the side of the condenser in contact with the cold plate in the liquid-cooling heat dissipation cabinet.

In an embodiment of the present disclosure, a plurality of condensers may be fixed on the exterior sidewalls of the chassis of a liquid-cooling heat dissipation device. Therefore, the sidewall of each condenser needs to have a heat-conductive pad, so that when the condenser contacts the cold plate inside the liquid-cooling heat dissipation cabinet, heat transfer can be improved with the help of the heat-conductive pad, thereby allowing better cooperative heat dissipation between the liquid-cooling heat dissipation device and the liquid-cooling heat dissipation cabinet, enhancing the heat dissipation effect.

Regarding the heat-conductive pad arranged on the sidewall of the condenser, it can be made up of reusable materials in practical applications.

Likewise, the heat-conductive pad arranged between the heat-generating electronic components and the evaporator can also be made of reusable materials.

From the above description, it is not difficult to find that in the liquid-cooling heat dissipation device provided in this embodiment, an evaporator is arranged at the heat-generating electronic element, a condenser is fixed on the exterior sidewall of the chassis, and the evaporator and the condenser are connected through vapor pipelines and liquid pipelines. Through the cooperation of the evaporator and the condenser, the existing direct liquid cooling is changed to vaporization followed by liquefaction, which greatly improves the heat dissipation effect.

In addition, the liquid-cooling heat dissipation device, which includes heat dissipation mechanisms like the evaporator, condenser, vapor pipeline, and liquid pipeline, does not require quick connectors. This design eliminates the risk of liquid leakage within the liquid-cooling heat dissipation device caused by quick connectors.

According to the liquid-cooling heat dissipation device provided in this embodiment, very little liquid is required due to the vaporization and re-liquification method for cooling. Even in the event of a leak, it will not cause damage to electronic components inside the chassis.

According to the liquid-cooling heat dissipation device provided in this embodiment, no internal space within the chassis is occupied by arranging the condenser on the exterior sidewall of the chassis, and thus the layout of the vapor pipelines and the liquid pipelines will not affect the integrity of the hard drives in the hardware area, or the number of IO interfaces in the IO interface area of the chassis. This ensures better system performance.

According to the liquid-cooling heat dissipation device provided in this embodiment, with the aforementioned structure, there is no need to provide a liquid-cooling panel or a female quick connector on the front side of the chassis, rendering a more aesthetically pleasing overall appearance.

Another embodiment of the present disclosure relates to a liquid-cooling heat dissipation cabinet, primarily designed to house the liquid-cooling heat dissipation device described in the first embodiment. This cabinet assists the condensers in the liquid-cooling heat dissipation device to further dissipate heat from the heat-generating electronic components in the liquid-cooling heat dissipation device.

Understandably, in practical applications, for the liquid-cooling heat dissipation cabinet and the liquid-cooling heat dissipation device to cooperate optimally, the liquid-cooling heat dissipation cabinet can be customized based on the specifications of the liquid-cooling heat dissipation device it will house. For instance, when housing servers in a data center, which are typically standard-sized servers, the width of the liquid-cooling heat dissipation cabinet can be set to a standard width, like 800 mm.

To better understand the liquid-cooling heat dissipation cabinet mentioned in this embodiment, a detailed description thereof is given below with reference to FIGS. 4 to 7.

Figure 4:
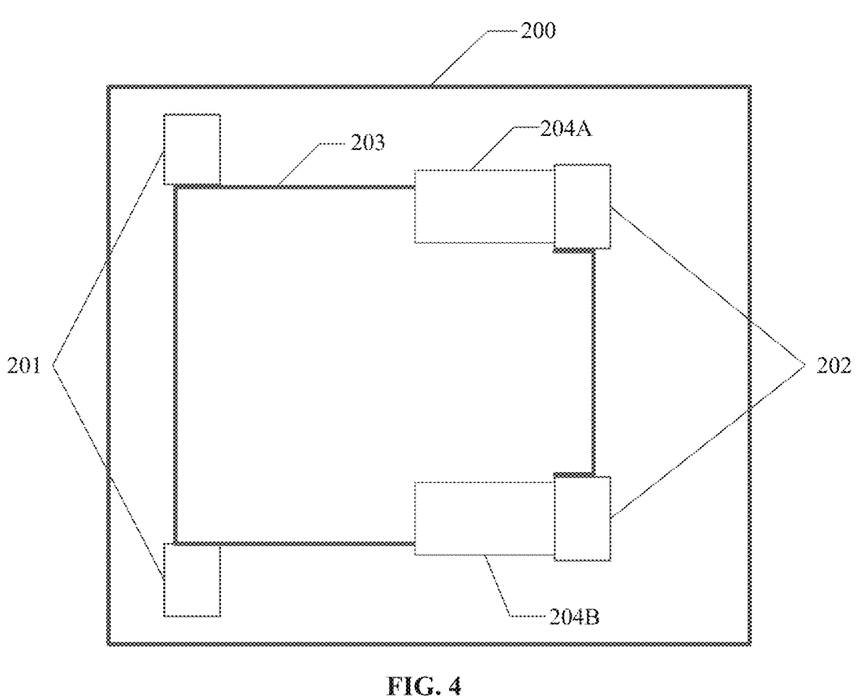
FIG. 4 is a top view of a liquid-cooling heat dissipation cabinet provided by another embodiment of the present disclosure.

As shown in FIG. 4, the liquid-cooling heat dissipation cabinet 200 in this embodiment includes: two front pillars 201 near a front door of the cabinet, two rear pillars 202 near a rear door of the cabinet, a chassis tray 203 for placing the liquid-cooling heat dissipation device provided by the first embodiment, and liquid cooling mechanisms 204A and 204B used in conjunction with the condensers (condensers 12A and 12B in FIG. 2) fixed on the exterior sidewall of the liquid-cooling heat dissipation device.

Since the liquid cooling mechanisms are used in conjunction with the condensers in the liquid-cooling heat dissipation device, the number of the liquid cooling mechanisms in the liquid-cooling heat dissipation cabinet 200 needs to be the same as and correspond one-to-one with the number of the condensers fixed on the exterior sidewall of the liquid-cooling heat dissipation device. FIG. 4 shows two liquid cooling mechanisms 204A and 204B, merely to illustrate that the liquid-cooling heat dissipation cabinet is used in conjunction with the liquid-cooling heat dissipation device shown in FIG. 2, which has two condensers 12A and 12B mounted on its exterior sidewalls. This is merely an example to facilitate understanding of the technical solution in this embodiment, and should not be seen as the only restriction on this embodiment.

As can be seen from FIG. 4, in a specific implementation, the chassis tray 203 is fixed within the area enclosed by the two front pillars 201 and the two rear pillars 202, and is secured through the two front pillars 201 and the two rear pillars 202.

Regarding the method of fixing the chassis tray 203, in specific implementations, it can be fixed by fixing parts such as bolts and buckles, or by forming grooves in the two front pillars 201 and the two rear pillars 202, and then inserting the chassis tray 203 into the grooves to fix it in place. Those skilled in the art can make adjustments as required, which is not limited in this embodiment.

It can be seen from FIG. 4 that, in a specific implementation, the liquid cooling mechanisms 204A and 204B are fixed above the chassis tray 203 and on the same side of the rear pillars 202 where the condensers are located.

The specific structures of the liquid cooling mechanisms 204A and 204B are described in detail below with reference to FIG. 5.

Figure 5:
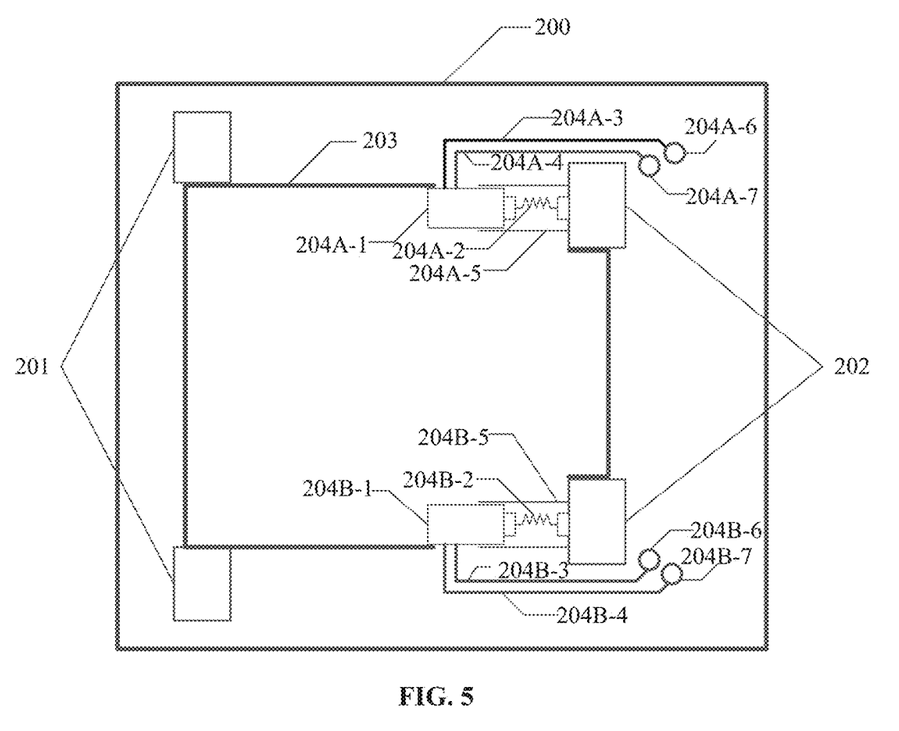
FIG. 5 is a schematic structural diagram of a specific structure of liquid cooling mechanisms 204A and 204B in a liquid-cooling heat dissipation cabinet 200 provided by another embodiment of the present disclosure.

As shown in FIG. 5, the liquid cooling mechanism 204A includes: a cold plate 204A-1, an elastic member 204A-2, an inlet pipeline 204A-3, an outlet pipeline 204A-4, a cold plate slide structure 204A-5, an inlet manifold 204A-6, and an outlet manifold 204A-7.

For the liquid cooling mechanism 204B, it similarly includes the above-mentioned seven structural components, as shown in FIG. 5: a cold plate 204B-1, an elastic member 204B-2, an inlet pipeline 204B-3, an outlet pipeline 204B-4, a cold plate slide structure 204B-5, an inlet manifold 204B-6, and an outlet manifold 204B-7.

For the convenience of description, the following takes the liquid cooling mechanism 204A as an example to describe the installation positions of the above seven structural components.

As shown in FIG. 5, the cold plate slide structure 204A-5 is fixed on the rear pillar 202. One end of the elastic member 204A-2 is fixed on the rear pillar 202, and is located between the corresponding areas of the cold plate slide structure 204A-5. The cold plate 204A-1 is fixed to the other end of the elastic member 204A-2 and is slidably mounted inside the cold plate slide structure 204A-5. It is connected to the inlet manifold 204A-6 through the inlet pipeline 204A-3, and to the outlet manifold 204A-7 through the outlet manifold 204A-4.

When the cold plate 204A-1 is not in contact with the heat-conductive pad (15A in FIG. 2) provided on the condenser (12A in FIG. 2), the elastic member 204A-2 is in a naturally extended state. When the cold plate 204A-1 is in contact with the heat-conductive pad (15A in FIG. 2) provided on the condenser (12A in FIG. 2), the elastic member 204A-2 is in a compressed state, enabling the cold plate 204A-1 to make contact heat transfer with the condenser (12A in FIG. 2) through the heat-conductive pad (15A in FIG. 2) and assist in dissipating heat from the heat-generating electronic components (16A in FIG. 2) inside the liquid-cooling heat dissipation device through the condenser (12A in FIG. 2) and the evaporator (11A in FIG. 2) within the liquid-cooling heat dissipation device.

Regarding the aforementioned inlet manifolds 204A-6, 204B-6, and the outlet manifolds 204A-7, 204B-7, they are commonly referred to as manifolds.

Regarding the cold plates 204A-1 and 204B-1, a cold plate with a fin structure is used in this embodiment. For the convenience of description, the following takes the cold plate 204A-1 as an example, and will be described in detail with reference to FIG. 6.

Figure 6:
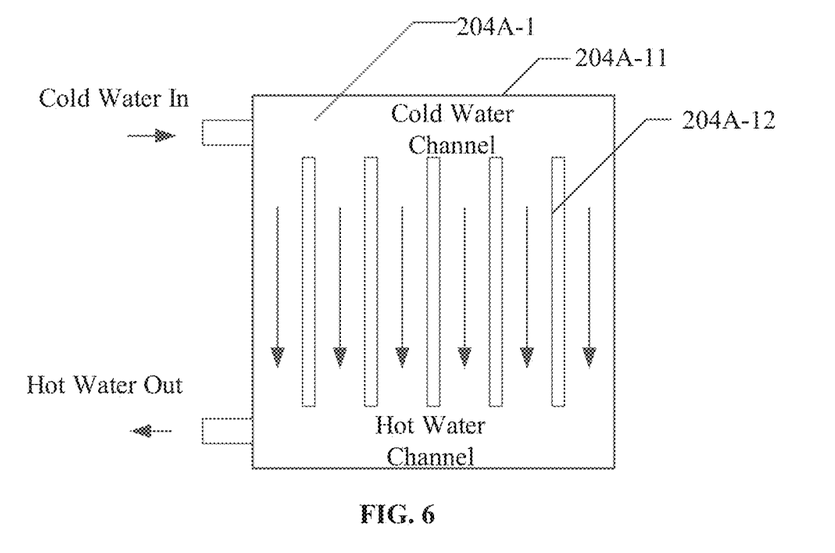
FIG. 6 is a schematic internal structural diagram of a cold plate 204A-1 in the liquid cooling mechanism 204A in the liquid-cooling heat dissipation cabinet 200 provided by another embodiment of the present disclosure.

As shown in FIG. 6, the cold plate 204A-1 includes a base plate (not shown in FIG. 6), a casing 204A-11, a plurality of condenser fins 204A-12, a cold water inlet and a hot water outlet.

In a specific implementation, the casing 204A-11 and the base plate form a sealed chamber, and the plurality of condenser fins 204A-12 are fixed side by side at intervals on the base plate inside the chamber. The cold water inlet connected to the inlet manifold 204A-6 (in FIG. 5) is set on one end of the sidewall of the casing 204A-11, parallel to the plurality of condenser fins 204A-12. The hot water outlet connected to the outlet manifold 204A-7 is set on the other end of the same sidewall of the casing 204A-11, parallel to the plurality of condenser fins 204A-12, as shown in FIG. 6.

In practical applications, the cold water absorbs the heat transferred by the condenser 12A (in FIG. 2) through the heat-conductive pad 15A (in FIG. 2) and turns into hot water. To ensure that the hot water can flow out from the outlet manifold 204A-7 in time, the hot water outlet needs to be set at the bottom of the sidewall of the casing 204A-11, parallel to the plurality of condenser fins 204A-12 as shown in FIG. 6. This ensures that even if there's minimal hot water produced after absorbing heat, it can flow out from the outlet manifold 204A-7.

The above examples are only examples for better understanding of the technical solutions of the present embodiment, and should not be construed as the only limitations to this embodiment.

In addition, regarding the cold plate slide structure mentioned in this embodiment, whether it is 204A-5 or 204B-5 in FIG. 5, in a specific implementation, it can be divided into two parts: a first slide and a second slide.

The first slide and the second slide are fixed to the rear pillar at a predetermined distance, and the cold plate is slidably installed within an accommodating space formed by the first slide and the second slide.

The predetermined distance is slightly greater than the thickness of the cold plate. This ensures that the cold plate can be installed within the accommodating space formed by the first slide and the second slide, while ensuring that the shaking amplitude of the cold plate within the accommodating space is not excessive. This guarantees the smooth sliding process of the cold plate, allowing the condenser of the liquid-cooling heat dissipation device in contact with the cold plate to stably contact the cold plate, thereby ensuring the overall heat dissipation effect.

Regarding the elastic member mentioned in this embodiment, whether it is 204A-2 or 204B-2 in FIG. 5, to ensure the fixation effect of the elastic member with the cold plate and the rear pillar, the elastic member may include a first fixation portion and a second fixation portion.

Taking the elastic member as a spring as an example, one end of the spring extends outward to form the first fixation portion, and the other end extends outward to form the second fixation portion.

The first fixation part is fixed to the surface of the cold plate facing the rear pillar, and the second fixation part is fixed to the surface of the rear pillar facing the cold plate.

The first fixation part may be fixed to the cold plate by means of gluing, screws, or the like.

The second fixation part may be fixed to the rear pillar by means of gluing, screws, or the like.

The above examples are only examples for better understanding of the technical solutions of the present embodiment, and should not be construed as the only limitations to this embodiment.

In practical applications, multiple liquid-cooling heat dissipation devices might be placed within a liquid-cooling heat dissipation cabinet. To ensure the heat dissipation effect of the heat-generating electronic components in each liquid-cooling heat dissipation device, multiple chassis trays can be fixed between the two front pillars and two rear pillars of the liquid-cooling heat dissipation cabinet at predetermined intervals. Moreover, above each chassis tray, a liquid cooling mechanism can be fixed to the rear pillar on the same side as the condenser.

In an embodiment of the present disclosure, to ensure that the chassis tray can be stably fixed to the front pillar and the rear pillar and to prevent the chassis (of the liquid-cooling heat dissipation device) placed on the chassis tray from sliding out from the left and right sides, the chassis tray can be a U-shaped groove tray. The sidewalls of the U-shaped groove tray are arranged to be fixed and in contact with the front pillar and the rear pillar on the same side respectively.

Figure 7:
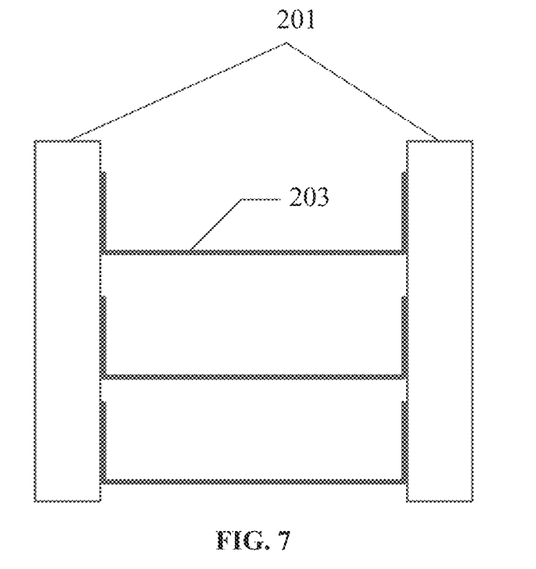
FIG. 7 is a side view of a liquid-cooling heat dissipation cabinet according to another embodiment of the present disclosure, viewed from the perspective of the cabinet front door.

FIG. 7 shows the arrangement of a multi-layer U-shaped groove structure of the chassis tray in the liquid-cooling heat dissipation cabinet.

Because it is ensured that after the liquid-cooling heat dissipation device is installed in the liquid-cooling heat dissipation cabinet, the condenser on the exterior sidewall of the liquid-cooling heat dissipation device can compress the elastic member to a compressed state after contacting with the cold plate of the liquid cooling mechanism in the liquid-cooling heat dissipation cabinet, and ensured that the elastic member remains in a compressed state during this period, this can provide sufficient pressure to the heat-conductive pad between the condenser and the cold plate, ensuring good heat transfer between the condenser and the cold plate through the heat-conductive pad. The liquid-cooling heat dissipation cabinet also includes a chassis fixation member.

In an embodiment of the present disclosure, the chassis fixation member is used to fix the liquid-cooling heat dissipation device placed on the chassis tray to the two front pillars, ensuring that the elastic member remains in a compressed state.

Regarding the aforementioned chassis fixation member, in practical applications, it may be composed of two parts: screws and lugs. Moreover, in practical applications, to ensure the fixation effect of the chassis, lugs need to be fixed on the two exterior sidewalls of the chassis. Then, using screws, the two lugs are fixed to the front pillars on both sides, achieving the fixation of the liquid-cooling heat dissipation device to the two front pillars.

In an embodiment of the present disclosure, due to the condenser of a certain height fixed on the exterior sidewall of the chassis of the liquid-cooling heat dissipation device, there is a slight gap between the exterior sidewall of the chassis and the sidewall of the chassis tray. To further ensure the fixation of the chassis and to prevent any wobbling of the liquid-cooling heat dissipation device placed on the chassis tray in case the liquid-cooling heat dissipation cabinet is bumped, which could lead to the dislocation of the resistive components inside the chassis and affect overall performance, the liquid-cooling heat dissipation cabinet may also include a chassis auxiliary structure.

In an embodiment of the present disclosure, the chassis auxiliary structure is arranged on the exterior sidewall of the chassis of the liquid-cooling heat dissipation device fixed with the condenser. When the liquid-cooling heat dissipation device is inserted into the liquid-cooling heat dissipation cabinet along the chassis tray, it aligns with the sidewall of the chassis tray.

By implementing the chassis auxiliary structure, not only can the chassis be further secured, but due to its alignment with the sidewall of the chassis tray, it also facilitates the sliding of the chassis along the opening direction of the chassis tray. This makes it easier to fix the chassis onto the chassis tray or to remove it.

In an embodiment of the present disclosure, the liquid-cooling heat dissipation cabinet provided in this embodiment needs to cooperate with the liquid-cooling heat dissipation device, and the heat from the condenser, which is fixed on the exterior sidewall of the liquid-cooling heat dissipation device's chassis, is absorbed through the cold plate. This assists the condenser in quickly cooling the high-temperature vapor, which has been evaporated by the heat-generating electronic components, back into a lower-temperature liquid. The vapor inlet of the condenser needs to be arranged opposite to a cold water inlet of the cold plate connected to the manifold, while the liquid outlet of the condenser needs to be opposite to a hot water outlet of the cold plate connected to the manifold. Taking the condenser as 12A in FIG. 2, the heat-conductive pad as 15A, and the cold plate as 204A-1 in FIG. 5 as an example, the arrangement of these three components is detailed in FIG. 8.

Figure 8:
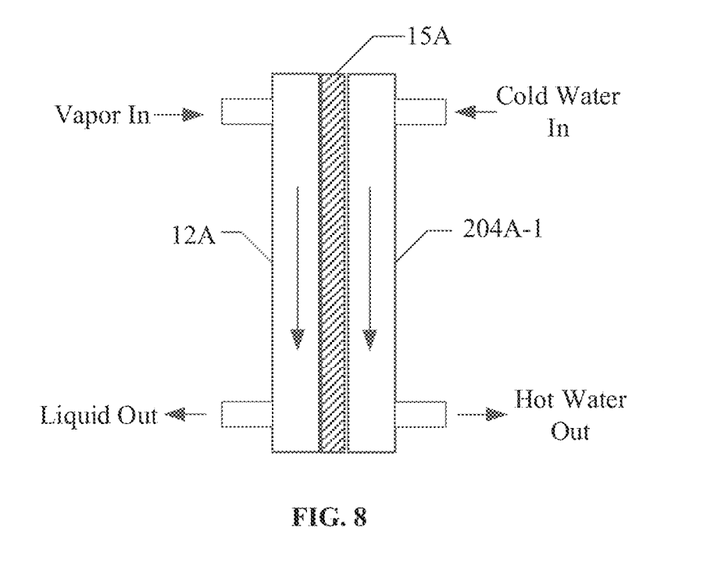
FIG. 8 is a schematic diagram illustrating the relationship between the condenser 12A, the heat-conductive pad 15A of the liquid-cooling heat dissipation device, and the cold plate 204A-1 of the liquid-cooling mechanism 204A in the liquid-cooling heat dissipation cabinet, in the liquid-cooling heat dissipation system provided by another embodiment of the present disclosure.

Based on this setting, when high-temperature vapor enters the condenser through the vapor inlet, its heat is transferred to the oppositely arranged cold plate through the heat-conductive pad. The cold water, which flows into the cold plate from the cold water inlet, then absorbs the transferred heat and turns it into hot water. The hot water then flows out from the hot water outlet on the cold plate, thereby carrying away the heat and achieving secondary heat dissipation.

From the above description, it is not difficult to find that in the liquid-cooling heat dissipation cabinet provided in this embodiment, a cold plate is arranged in the liquid-cooling heat dissipation cabinet to assist the condenser in the liquid-cooling heat dissipation device to perform secondary heat dissipation, which, in turn, enhances the heat dissipation for the heat-generating electronic components in the liquid-cooling heat dissipation device, further improving the cooling effect.

According to the liquid-cooling heat dissipation cabinet provided in this embodiment, the cold plate in the liquid-cooling heat dissipation cabinet and the condenser on the liquid-cooling heat dissipation device do not need to be connected through quick connectors, thereby avoiding the risk of liquid leakage caused by the use of quick connectors.

Yet another embodiment of the present disclosure provides a liquid-cooling heat dissipation system, including the liquid-cooling heat dissipation device provided in the foregoing embodiment and the liquid-cooling heat dissipation cabinet provided by the foregoing embodiment.

Figure 9:
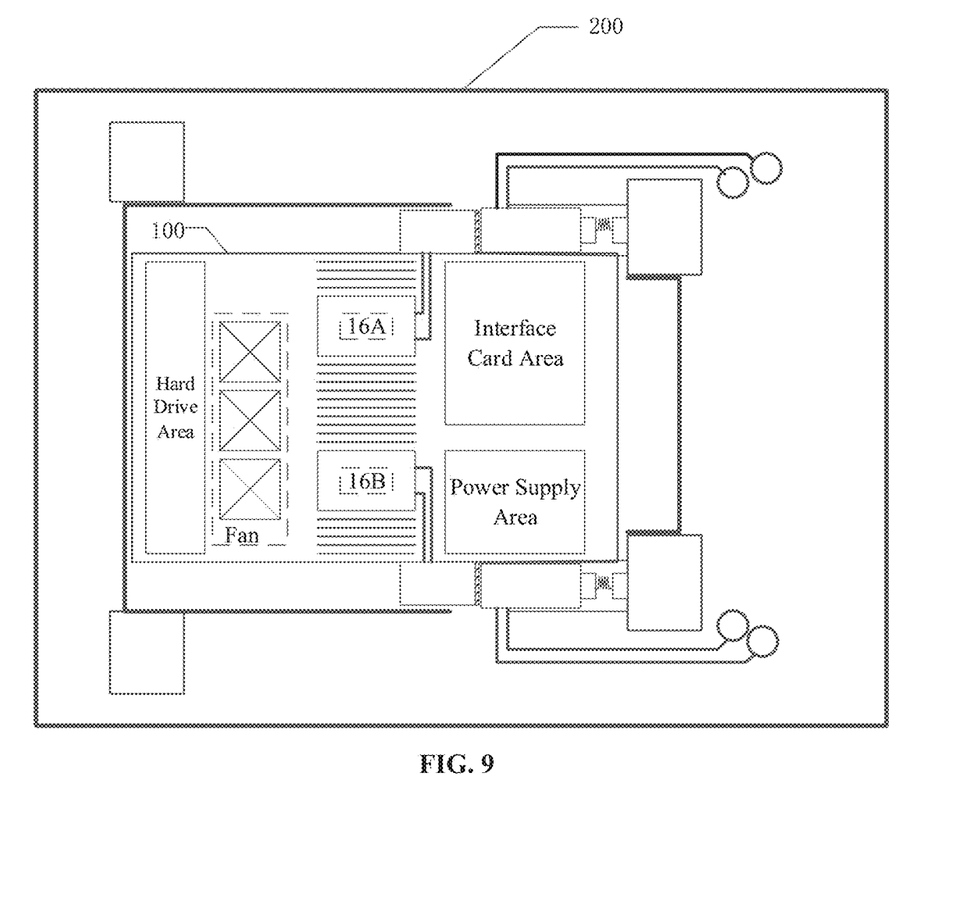
FIG. 9 is a schematic structural diagram of a liquid-cooling heat dissipation system provided by yet another embodiment of the present disclosure.

As shown in FIG. 9, the liquid-cooling heat dissipation device (chassis 100 in FIG. 9) is placed on the chassis tray in the liquid-cooling heat dissipation cabinet 200, and when being mounted along the chassis tray into the liquid-cooling heat dissipation cabinet, each condenser fixed on the exterior sidewall of the liquid-cooling heat dissipation device contacts with a cold plate fixed on the rear pillar of the liquid-cooling heat dissipation cabinet through a heat-conductive pad. The cold plate slides towards the rear pillar along a clod plate slide structure, compressing an elastic member located between the cold plate and the rear pillar from a naturally extended state to a compressed state. This ensures heat transfer contact between the cold plate and the condenser through the heat-conductive pad, assisting in the dissipation of heat from the heat-generating electronic components within the liquid-cooling heat dissipation device through the condenser and the evaporator inside the liquid-cooling heat dissipation device.

From the above description, it is not difficult to find that in the liquid-cooling heat dissipation system provided in this embodiment, by setting the cold plate in the liquid-cooling heat dissipation cabinet to contact the condenser on the exterior sidewall of the chassis of the liquid-cooling heat dissipation device through the heat-conductive pad, secondary heat dissipation can be achieved, which effectively cools the heat-generating electronic components in the liquid-cooling heat dissipation device, thereby enhancing the overall cooling effect.

According to the liquid-cooling heat dissipation system provided in this embodiment, the direct heat transfer between the condenser in the liquid-cooling heat dissipation device and the cold plate in the liquid-cooling heat dissipation cabinet is facilitated by the heat-conductive pad, eliminating the need for quick connectors and hoses. Thus, during actual maintenance, there's no need to plug or unplug quick connectors and rearrange hoses; one only needs to take out the chassis from the chassis tray. This not only ensures efficient cooling but also significantly facilitates maintenance for the staff.

The above are merely preferred embodiments of this disclosure and do not limit the patent scope of this disclosure. Any equivalent structural changes made under the inventive concept of this disclosure, or direct/indirect applications in other related technical fields, are all included within the patent protection scope of this disclosure.

What is claimed is:

1. A liquid-cooling heat dissipation cabinet comprising:
two front pillars near a front door of the liquid-cooling heat dissipation cabinet;
two rear pillars near a rear door of the liquid-cooling heat dissipation cabinet;
a chassis tray for placing a liquid-cooling heat dissipation device; and
a liquid cooling mechanism used in conjunction with a condenser fixed on an exterior sidewall of the liquid-cooling heat dissipation device,
wherein the chassis tray is fixed within an area enclosed by the two front pillars and the two rear pillars, and is secured through the two front pillars and the two rear pillars;
the liquid cooling mechanism is fixed above the chassis tray, on one of the rear pillars on the same side as the condenser;
the liquid-cooling heat dissipation device comprises: a chassis, a circuit board, an evaporator, a heat-generating electronic component, a condenser, a vapor pipeline, and a liquid pipeline;
an exterior sidewall of the chassis is equipped with a pipeline outlet, and the exterior sidewall is an exterior wall of a side panel in contact with a chassis panel and an IO port panel of the chassis;
the circuit board is fixed on an inner bottom surface of the chassis;
the evaporator is fixed on the circuit board with a preset gap, forming an accommodating space with the circuit board;
the heat-generating electronic component is mounted on the circuit board within the accommodating space, electrically connected to the circuit board and thermally connected to the evaporator;
the condenser is fixed on the exterior sidewall where the pipeline outlet is located;
the vapor pipeline and the liquid pipeline pass through the pipeline outlet, connecting the evaporator with the condenser; and
when the heat-generating electronic component is operating, liquid inside the evaporator absorbs heat emitted by the heat-generating electronic component and vaporizes into vapor, enters the condenser along the vapor pipeline under the internal vapor pressure, and returns to the evaporator along the liquid pipeline after being cooled into liquid by the condenser;
the liquid cooling mechanism comprises: a cold plate, an elastic member, an inlet pipeline, an outlet pipeline, a cold plate slide structure, an inlet manifold, and an outlet manifold; wherein
the cold plate slide structure is fixed on one of the rear pillars;
one end of the elastic member is fixed on one of the rear pillars, and is located between corresponding areas of the cold plate slide structure;
the cold plate is fixed to an other end of the elastic member and is slidably mounted inside the cold plate slide structure, connecting to the inlet manifold through the inlet pipeline, and connecting to the outlet manifold through the outlet pipeline;
wherein, when the cold plate is not in contact with a heat-conductive pad provided on the condenser, the elastic member is in a naturally extended state; when the cold plate is in contact with the heat-conductive pad provided on the condenser, the elastic member is in a compressed state, enabling the cold plate to make conductive heat transfer with the condenser through the heat-conductive pad, and assist in dissipating heat from the heat-generating electronic component inside the liquid-cooling heat dissipation device through the condenser and the evaporator within the liquid-cooling heat dissipation device.

2. The liquid-cooling heat dissipation cabinet according to claim 1, wherein, the cold plate slide structure comprises a first slide and a second slide; and the elastic member comprises a first fixation part and a second fixation part; wherein
the first slide and the second slide are fixed to the two rear pillars at a predetermined distance, and the predetermined distance is slightly greater than the thickness of the cold plate;
the cold plate is slidably installed within a second accommodating space formed by the first slide and the second slide; and
the first fixation part is fixed to a surface of the cold plate facing one of the rear pillars, and the second fixation part is fixed to a surface of one of the rear pillars facing the cold plate.

3. The liquid-cooling heat dissipation cabinet according to claim 1, wherein, the vapor pipeline of the condenser is arranged opposite to a cold water inlet of the cold plate connected to a manifold, and the liquid pipeline of the condenser is arranged opposite to a hot water outlet of the cold plate connected to the manifold.

4. The liquid-cooling heat dissipation cabinet according to claim 1, wherein, the liquid cooling heat dissipation cabinet further comprises: a chassis fixation member, wherein
the chassis fixation member is used to fix the liquid-cooling heat dissipation device placed on the chassis tray to the two front pillars, ensuring that the elastic member remains in a compressed state.

5. The liquid-cooling heat dissipation cabinet according to claim 1, wherein the condenser comprises a base plate, a casing, a plurality of condenser fins, a vapor inlet and a liquid outlet,
wherein the casing and the base plate form a sealed chamber;
the plurality of condenser fins are arranged side by side at intervals and fixed to the base plate within the sealed chamber;
the vapor inlet, which connects to the vapor pipeline, is located at one end of a sidewall of the casing, parallel to the plurality of condenser fins; and
the liquid outlet, which connects to the liquid pipeline, is located at an opposite end of the sidewall of the casing, parallel to the plurality of condenser fins.

6. The liquid-cooling heat dissipation cabinet according to claim 1, wherein, the number of the condenser is even, and
the pipeline outlet is formed on two opposite exterior sidewalls of the chassis, and the condensers are symmetrically fixed on the exterior sidewalls where the pipeline outlets are located.

7. The liquid-cooling heat dissipation cabinet according to claim 1, wherein, the liquid-cooling heat dissipation device further comprises a heat-conductive pad, and
the heat-conductive pad is placed on a side of the condenser to be in contact with the cold plate in the liquid-cooling heat dissipation cabinet.

8. A liquid-cooling heat dissipation system, comprising: a liquid-cooling heat-dissipation device, and a liquid-cooling heat dissipation cabinet,
wherein the liquid-cooling heat dissipation device comprises: a chassis, a circuit board, an evaporator, a heat-generating electronic component, a condenser, a vapor pipeline, and a liquid pipeline;
an exterior sidewall of the chassis is equipped with a pipeline outlet, and the exterior sidewall is an exterior wall of a side panel in contact with a chassis panel and an IO port panel of the chassis;
the circuit board is fixed on an inner bottom surface of the chassis;
the evaporator is fixed on the circuit board with a preset gap, forming an accommodating space with the circuit board;
the heat-generating electronic component is mounted on the circuit board within the accommodating space, electrically connected to the circuit board and thermally connected to the evaporator;
the condenser is fixed on the exterior sidewall where the pipeline outlet is located;
the vapor pipeline and the liquid pipeline pass through the pipeline outlet, connecting the evaporator with the condenser;
when the heat-generating electronic component is operating, liquid inside the evaporator absorbs heat emitted by the heat-generating electronic component and vaporizes into vapor, enters the condenser along the vapor pipeline under the internal vapor pressure, and returns to the evaporator along the liquid pipeline after being cooled into liquid by the condenser;
the liquid-cooling heat dissipation cabinet comprises: two front pillars near a front door of the liquid-cooling heat dissipation cabinet, two rear pillars near a rear door of the liquid-cooling heat dissipation cabinet, a chassis tray for placing the liquid-cooling heat dissipation device, and a liquid cooling mechanism used in conjunction with the condenser fixed on the exterior sidewall of the liquid-cooling heat dissipation device;
the chassis tray is fixed within an area enclosed by the two front pillars and the two rear pillars, and is secured through the two front pillars and the two rear pillars;
the liquid cooling mechanism is fixed above the chassis tray, on one of the rear pillars on the same side as the condenser; and
the liquid-cooling heat dissipation device is placed on the chassis tray in the liquid-cooling heat dissipation cabinet, and when being mounted along the chassis tray into the liquid-cooling heat dissipation cabinet, each condenser fixed on the exterior sidewall of the liquid-cooling heat dissipation device contacts with a cold plate fixed on the rear pillar in the liquid-cooling heat dissipation cabinet through a heat-conductive pad, and the cold plate slides towards the rear pillar along a cold plate slide structure, compressing an elastic member between the cold plate and one of the rear pillars from a naturally extended state to a compressed state, which ensures the cold plate conducts heat to the condenser through contact with the heat-conductive pad, assisting the condenser and the evaporator inside the liquid-cooling heat dissipation device in dissipating heat from the heat-generating electronic component within the liquid-cooling heat dissipation device.

* * * * *